US012804862B2

(12) United States Patent
Moon et al.

(10) Patent No.: US 12,804,862 B2
(45) Date of Patent: Nov. 17, 2026

(54) TEMPERATURE MANAGEMENT SYSTEM AND METHOD FOR ROOM WITH CHARGE DISCHARGE DEVICE INSTALLED

(71) Applicant: SK On Co., Ltd., Seoul (KR)

(72) Inventors: Sin Young Moon, Daejeon (KR); Chang Mook Hwang, Daejeon (KR); Gyeong Min Ryu, Daejeon (KR); Mi So Rho, Daejeon (KR); Seung Hyun Yook, Daejeon (KR); Ji A Lee, Daejeon (KR)

(73) Assignee: SK ON CO., LTD., Seoul (KR)

( * ) Notice: Subject to any disclaimer, the term of this patent is extended or adjusted under 35 U.S.C. 154(b) by 344 days.

(21) Appl. No.: 18/436,019

(22) Filed: Feb. 8, 2024

(65) Prior Publication Data

US 2024/0397676 A1 Nov. 28, 2024

(30) Foreign Application Priority Data

May 24, 2023 (KR) ........................ 10-2023-0067093

(51) Int. Cl.
*H05K 7/20* (2006.01)
*H02J 7/70* (2026.01)

(52) U.S. Cl.
CPC ............ *H05K 7/20909* (2013.01); *H02J 7/70* (2026.01); *H05K 7/20945* (2013.01)

(58) Field of Classification Search
None
See application file for complete search history.

(56) References Cited

U.S. PATENT DOCUMENTS

2004/0089010 A1* 5/2004 Patel ........................ F25B 49/02 62/186
2015/0192316 A1* 7/2015 Zhou ........................ F24F 11/37 700/276
2024/0074125 A1* 2/2024 Lee ..................... H01M 10/441

FOREIGN PATENT DOCUMENTS

JP 2010-257431 A 11/2010
JP 2014-191783 A 10/2014
KR 10-2391931 B1 4/2022

* cited by examiner

*Primary Examiner* — Paul B Yanchus, III
(74) *Attorney, Agent, or Firm* — IP & T GROUP LLP

(57) ABSTRACT

A temperature management system for a room with a charge discharge device installed is provided, and the temperature management system includes one or more charge discharge devices installed in a room, performing charging or discharging of a battery, and including an external air conditioning module adjusting air temperature in the room, and a managing server controlling operation of the external air conditioning module of each of the charge discharge devices to adjust temperature in the room. When the temperature of the room with a charge discharge device installed increases due to heat generated by charging or discharging of the battery, the charge discharge devices may cool the air of the room, and a load to an air conditioner installed in a building can be reduced.

8 Claims, 8 Drawing Sheets

TEMPERATURE MANAGEMENT SYSTEM AND METHOD FOR ROOM WITH CHARGE DISCHARGE DEVICE INSTALLED

CROSS REFERENCE TO RELATED APPLICATION

This patent document claims the priority and benefits of Korean Patent Application No. 10-2023-0067093, filed May 24, 2023, the entire contents of which are incorporated herein by reference for all purposes.

TECHNICAL FIELD

The disclosed technology relates to a system and a method for managing the temperature of a room with a charge discharge device installed.

BACKGROUND

A secondary battery is a battery that can be charged and discharged. A battery is widely used in portable devices such as smartphones, laptops, and tablet PCs, and in transportation such as electric vehicles and electric bicycles.

In an activation process of a battery manufacturing process, a battery is charged and discharged a set number of times. In a testing process of a battery or a development process of new products, tests of charging and discharging a battery are performed. While charging and discharging a battery, the performance of the battery can be checked and whether it is defective can be checked. When a battery is charged or discharged, heat may be generated.

SUMMARY

The disclosed technology provides a system and a method for managing the temperature of a room with a charge discharge device installed.

The disclosed technology provides a system and a method for managing the temperature of a space equipped with one or more charge discharge devices performing charging and discharging of a battery.

Based on an embodiment of the disclosed technology, a temperature management system for a room with a charge discharge device installed may include one or more charge discharge devices installed in a room, performing charging or discharging of a battery, and comprising an external air conditioning module adjusting the air temperature in the room, and a managing server controlling operation of the external air conditioning module of each of the charge discharge devices to adjust the temperature in the room.

In an embodiment, each of the charge discharge devices may include one or more chambers each storing the battery therein and performing charging or discharging of the battery a cycler charging and discharging the battery that is connected thereto through the chambers a cooling channel supplied with a refrigerant for reducing heat generated due to the charging or discharging an external temperature sensor measuring the peripheral temperature of each of the charge discharge devices to provide the measured the temperature to the managing server and the external air conditioning module adjusting the air temperature of the room based on control of the managing server.

In an embodiment, the external air conditioning module may adjust the temperature of external air by using all or part of the refrigerant supplied through the cooling channel.

In an embodiment, the cooling channel may be a separate channel that may be independent from a channel supplying a refrigerant to an air conditioner adjusting the temperature of the room with a charge discharge device installed.

In an embodiment, when the peripheral temperature of one of the charge discharge devices is equal to or higher than a first reference temperature, the managing server may control the corresponding charge discharge device so that the external air conditioning module of the charge discharge device may be operated, and when the peripheral temperature of the charge discharge device is equal to or higher than a second reference temperature, the managing server may control another charge discharge device, which is installed within a range preset based on the corresponding charge discharge device, so that the external air conditioning module of the charge discharge device may be also operated.

In an embodiment, when the peripheral temperature of one of the charge discharge devices is equal to or higher than the first reference temperature, and when a cooling idle capacity of the charge discharge device is equal to or higher than a first reference capacity, the managing server may control the charge discharge device so that the external air conditioning module of the charge discharge device may be operated, and when the cooling idle capacity of the charge discharge device is less than the first reference capacity, the managing server may control another charge discharge device, which is installed within a range preset based on the corresponding charge discharge device, so that the external air conditioning module of the charge discharge device may be operated.

In an embodiment, the managing server may receive the peripheral temperature from the plurality of charge discharge devices installed in the room, and calculate the temperature for each of a plurality of zones preset in advance based on the received temperature, and when the temperature of one zone is equal to or higher than a first zone reference temperature, the managing server may control the charge discharge devices, which are located in the corresponding zone, so that the external air conditioning module of each of the charge discharge devices may be operated.

In an embodiment of the disclosed technology, a temperature management method for a room with a charge discharge device installed may include receiving, by a managing server, peripheral temperature of one or more charge discharge devices installed in the room, from the charge discharge devices, and adjusting, by the managing server, the temperature of the room by controlling operation of an external air conditioning module of each of the charge discharge devices, based on the peripheral temperature of each of the charge discharge devices.

In an embodiment, the adjusting of the room temperature may include comparing, by the managing server, the peripheral temperature of each of the charge discharge devices and a first reference temperature; and when the peripheral temperature of one of the charge discharge devices is equal to or higher than the first reference temperature, operating, by the managing server, the external air conditioning module of the charge discharge device.

In an embodiment, the adjusting of the room temperature may further include comparing, by the managing server, the peripheral temperature of the charge discharge device and a second reference temperature and when the peripheral temperature of the charge discharge device is equal to higher than the second reference temperature, operating, by the managing server, another charge discharge device, which is installed in a range preset based on the corresponding charge discharge device, so that the external air conditioning module of the charge discharge device is operated.

In an embodiment, the adjusting of the room temperature may further include comparing, by the managing server, the peripheral temperature of each of the charge discharge devices and a first reference temperature, when the peripheral temperature of one of the charge discharge devices is equal to or higher than the first reference temperature, comparing, by the managing server, a cooling idle capacity of the corresponding charge discharge device and a first reference capacity, when the cooling idle capacity is equal to or higher than the first reference capacity, operating, by the managing server, the external air conditioning module of the corresponding charge discharge device, and when the cooling idle capacity is less than the first reference capacity, operating, by the managing server, another charge discharge device, which is installed within a range preset based on the corresponding charge discharge device, so that the external air conditioning module of the charge discharge device is operated.

In an embodiment, the adjusting of the room temperature may further include calculating, by the managing server, the temperature of a plurality of zones preset in advance, on the basis of the peripheral temperatures received from the plurality of charge discharge devices installed in the room, comparing the temperature of each zone and a first zone reference temperature, and when the temperature of one of the zones is equal to or higher than the first zone reference temperature, operating the external air conditioning module of each of the charge discharge devices that are located in the corresponding zone.

The features and advantages of the disclosed technology will become more apparent from the following detailed description based on the accompanying drawings.

Prior to this, the terms or words used in the disclosed technology and claims are not to be construed to their ordinary and dictionary meanings, and should be interpreted as meanings and concepts corresponding to the technical spirit of the disclosed technology based on the principle that inventors may properly define the concept of the terms in order to best describe their embodiments.

Based on the disclosed technology, it is possible to reduce a cooling load of the air conditioner arranged in the room with a charge discharge device installed.

DETAILED DESCRIPTION

Figure 1:
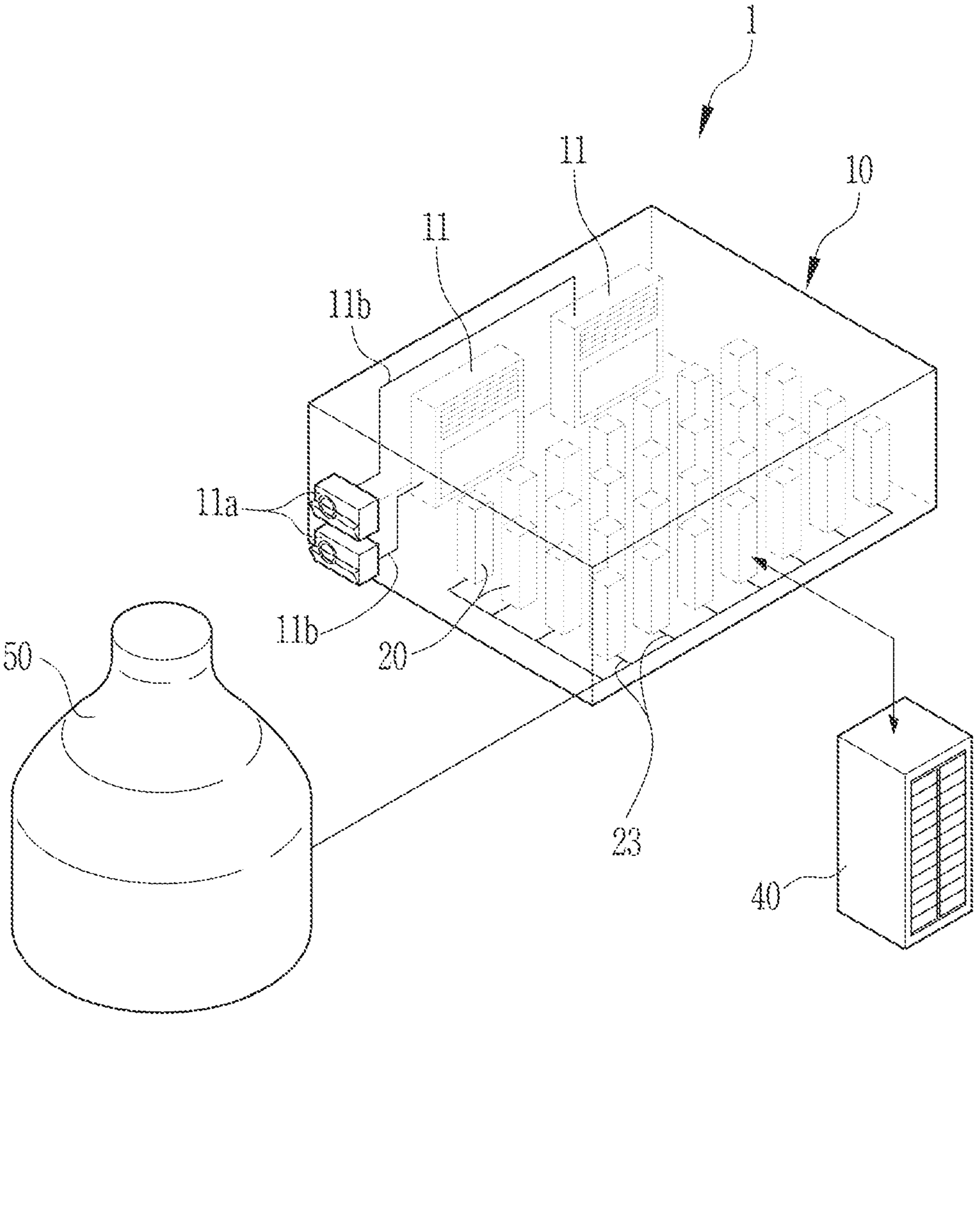
FIG. 1 is a view showing a room with charge discharge devices installed based on an embodiment.

Objectives, advantages, and features of the disclosed technology will become more apparent from the following detailed description taken in conjunction with the accompanying drawings and preferred embodiments, but the disclosed technology is not necessarily limited thereto. In addition, in describing the disclosed technology, when it is determined that a detailed description of a related known technology may unnecessarily obscure the subject matter of the disclosed technology, the detailed description thereof will be omitted.

In assigning reference numerals to components of the drawings, it should be noted that the same components are given the same reference numerals as much as possible even when they are shown in different drawings, and similar reference numerals are given to similar components.

The terminology used to describe embodiments of the disclosed technology is not intended to limit the disclosed technology. It should be noted that expressions in singular may include expressions in plural unless the context clearly indicates otherwise.

The drawings may be schematic or exaggerated to illustrate embodiments.

In the present document, expressions such as “has”, “may have”, “comprises”, “may comprise”, “includes”, or “may include” indicate the presence of corresponding characteristics (e.g., a numerical value, function, operation, or component such as a part), and does not exclude the presence of additional characteristics.

Terms such as “one”, “other”, “another”, “first”, “second”, etc. are used to distinguish one component from another, and components are not limited by the above terms.

It should be understood that the terms indicating direction, such as “upper”, “lower”, “left”, “right”, “X-axis”, “Y-axis”, “Z-axis”, etc., are only for convenience of description and may be expressed differently depending on the location of the observer or the location of the object.

The embodiments described in the present document and the accompanying drawings are not intended to limit the disclosed technology to specific embodiments. It should be understood that the disclosed technology includes various modifications, equivalents, and/or alternatives of the embodiments.

Hereinbelow, referring to accompanying drawings, an embodiment of the disclosed technology will be described in detail.

Figure 2:
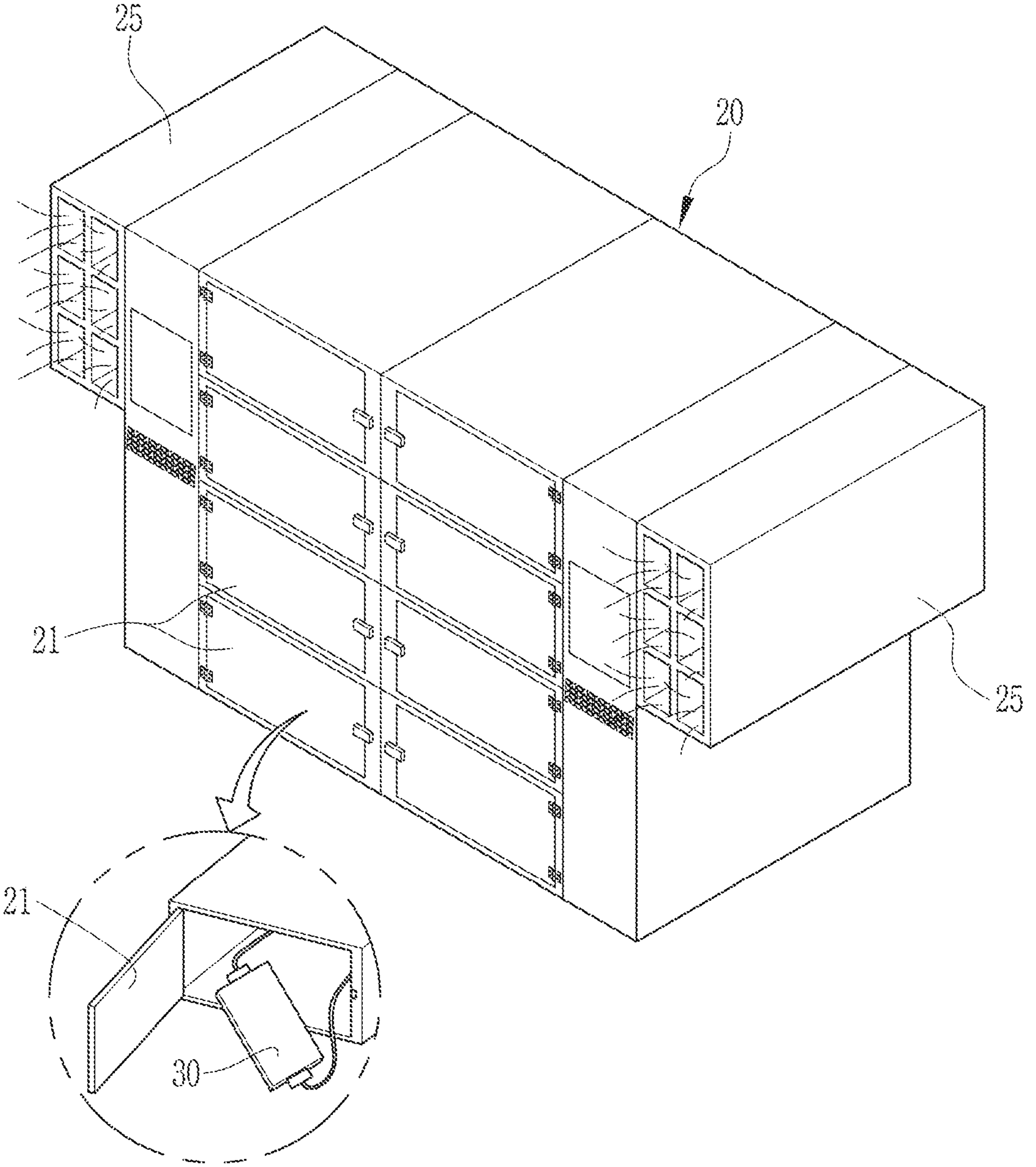
FIG. 2 is a view showing each charge discharge device based on an embodiment.
Figure 3:
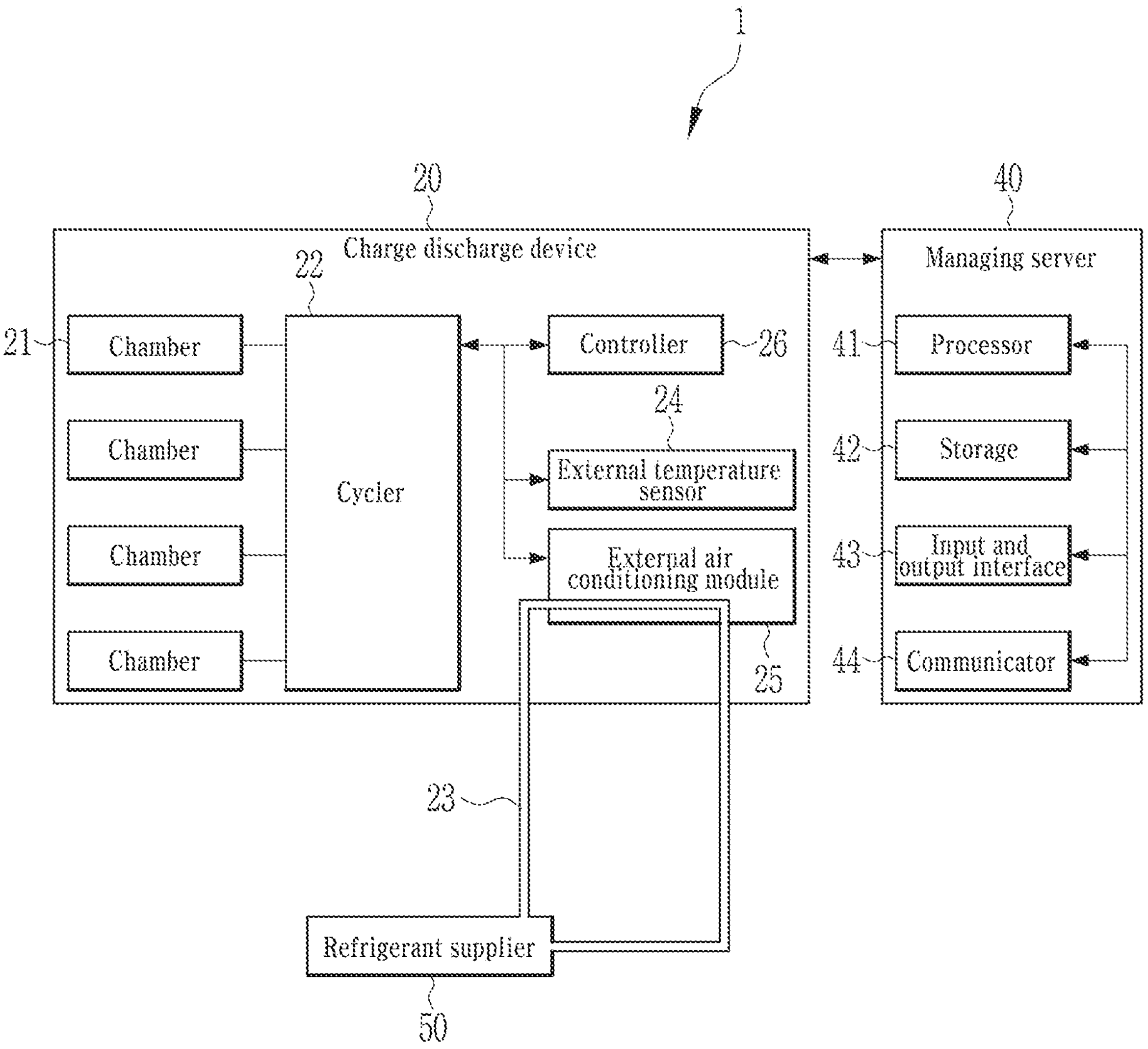
FIG. 3 is a view showing a temperature management system for a room with a charge discharge device installed based on an embodiment.

FIG. 1 is a view showing a room 10 with charge discharge devices 20 installed based on an embodiment. FIG. 2 is a view showing each charge discharge device 20 based on an embodiment. FIG. 3 is a view showing a temperature management system 1 for the room 10 with the charge discharge devices 20 installed based on an embodiment.

The temperature management system 1 for the room 10 with a charge discharge device 20 installed based on the embodiment includes one or more charge discharge devices 20 installed in the room, performing charging or discharge of a battery, and each including an external air conditioning module 25 adjusting the temperature of the room, and a managing server 40 controlling operation of the external air conditioning module 25 of each of the charge discharge devices 20 to adjust the room temperature.

The charge discharge devices 20 are a device performing charging or discharging of a battery. When the plurality of charge discharge devices 20 may perform charging or discharging of the battery, heat generated from the battery increases the room temperature. Although an air conditioner 11 is installed in order to adjust the room temperature, excessive heat generation may cause overload or malfunction of the air conditioner 11. Each of the charge discharge devices 20 based on the embodiment includes the external air conditioning module 25, and the external air conditioning module 25 may cool outside air of the charge discharge device 20 but not inside air thereof. When the peripheral temperature of the charge discharge devices 20 received from the charge discharge devices 20 is equal to or higher than a preset reference temperature, the managing server 40 may operate the external air conditioning modules 25 of the charge discharge devices 20 to reduce the room temperature. At this point, a channel 23 supplying a refrigerant to each of the charge discharge devices 20 is divided and separated from a channel 11*b* supplying a refrigerant to the air conditioner 11. Accordingly, the charge discharge devices 20 each including the external air conditioning module 25 based on the embodiment are installed in the room, and the external air conditioning module 25 is operated based on control of the managing server 40, so that a load to the air conditioner 11 can be minimized and the room temperature can be managed. Furthermore, more charge discharge devices 20 may be installed in the room by minimizing the space where the air conditioner 11 is installed.

The room 10 is a part of a building. The building may include a plurality of rooms 10. In the room 10, the plurality of charge discharge devices 20, the air conditioner 11, and other various devices may be installed. The room 10 where the plurality of charge discharge devices 20 is installed may be called as a battery evaluation room. The room 10 may be one building consisting of one undivided section. A plurality of battery evaluation rooms may be located in one building. The managing server 40 may manage the charge discharge devices 20 installed in the plurality of battery evaluation rooms.

The air conditioner 11 is a device that adjusts the air temperature of the room. The air conditioner 11 may perform cooling or heating. The air conditioner 11 may be connected to an outdoor unit 11*a* installed outside of the room and may cool the room 10. In summer or when the outside temperature of the room is high, the performance of the air conditioner 11 may be lowered, and the air conditioner 11 may not sufficiently remove heat generated by the charge discharge devices 20 installed in the room.

Each of the charge discharge devices 20 may include one or more chambers 21 respectively storing batteries therein and performing charging or discharging of the batteries, a cycler 22 charging or discharging the batteries connected thereto through the chambers 21, the refrigerant channel 23 supplied with a refrigerant for removing heat generated due to the charging or discharging, an external temperature sensor 24 measuring the peripheral temperature of the charge discharge devices 20 and providing the measured temperature to the managing server 40, and the external air conditioning module 25 adjusting the air temperature of the room based on control of the managing server 40. Each of the charge discharge devices 20 may include a controller 26 that controls the cycler 22, the external temperature sensor 24, and the external air conditioning module 25.

Each of the chambers 21 may have a space that can store a battery cell 30 therein, and may include a connector that is connected to the cycler 22 and connected to both of a positive terminal and a negative terminal of the battery cell 30. A user can open a door of the chambers 21 and put the battery cell 30 into each of the chambers 21 and connect the connector to the battery cell 30.

The charging or discharging of the battery cell may be performed for various purposes. The charging or discharging may be performed for activation of the battery cell 30, a deterioration test, a performance test or defect test. The battery cell 30 may be a battery capable of charging and discharging and containing lithium ions.

The cycler 22 may charge current to the battery cell 30 that is connected thereto through the connector, and may control the battery cell 30 to discharge the current from the battery cell 30. The cycler 22 may repeat charging and discharging based on a condition specified by the user.

The refrigerant channel 23 may supply the refrigerant supplied from a refrigerant supplier 50 installed outside of the room, to the charge discharge device 20. The refrigerant channel 23 may have a form of a pipe or tube that transfer the refrigerant. The refrigerant channel 23 may be a separate channel that is independent from the channel that supplies a refrigerant to the air conditioner 11 adjusting the temperature of the room 10 with a charge discharge device 20 installed. Each of the chambers 21 and the cycler 22 may cool heat generated by the battery cell 30 by using the refrigerant supplied through the refrigerant channel 23. A refrigerant line may supply a refrigerant to the chambers 21, the cycler 22, and the external air conditioning module 25. The refrigerant line may have a structure of air cooling or water cooling in aspect of cooling the chambers 21 and the cycler 22. The refrigerant line may supply the refrigerant to the external air conditioning module 25 in a method similar to the air conditioner 11, thereby reducing the air temperature of the room.

The refrigerant supplier 50 may be installed outside of the room, and may have a form of a cooling tower installed on a roof of the building including the room or installed outside of the building. The refrigerant supplier 50 may be a cooling tower having a large capacity that is required for reducing heat generated by the plurality of charge discharge devices 20.

The external temperature sensor 24 may be a sensor that measure the peripheral temperature of each of the charge discharge devices 20. The external temperature sensor 24 may include various types of temperature sensors. The temperature measured by the external temperature sensor 24 may be transferred to the managing server 40 through the controller 26 of each of the charge discharge devices 20. Otherwise, the temperature measured by the external temperature sensor 24 may be directly transferred to the managing server 40. The external temperature sensor 24 may be arranged at an upper portion of a location where the cycler 22 of each of the charge discharge devices 20 is located. The external temperature sensor 24 may be located at a casing of each of the charge discharge devices 20. Therefore, the temperature measured by the external temperature sensor 24 is the air temperature around each of the charge discharge devices 20. Since the external temperature sensor 24 is located at each of the charge discharge devices 20, when heat of each of the charge discharge devices 20 increases, the external temperature sensor 24 may measure the air temperature around each of the charge discharge devices 20.

The external air conditioning module 25 may adjust the temperature of the external air by using all or part of the refrigerant supplied through the refrigerant channel 23. At this point, the external part is referred to an external part of each of the charge discharge devices 20. In other words, the external air temperature is the air temperature of the room with a charge discharge device 20 installed. The external air conditioning module 25 may include components for the air conditioner 11 to cool the air by using a refrigerant, such as a fan, an evaporator, a compressor, a valve, etc. The external air conditioning module 25 may be controlled to be turned on/off based on control of the managing server 40. The external air conditioning module 25 may adjust a degree of cooling based on control of the managing server 40. When the external air conditioning module 25 is operated, the fan is rotated and sucks the room air into the external air conditioning module 25 to cool the air and outputs air at low temperature, thereby cooling the air around each of the charge discharge devices 20. The external air conditioning module 25 may be installed at an outer part of the casing of each of the charge discharge devices 20. One external air conditioning module 25 may be installed on one outer surface of each of the charge discharge devices 20, or two external air conditioning modules 25 are installed on opposite side surfaces of each of the charge discharge devices 20.

The controller 26 may control the cycler 22, the external temperature sensor 24, and the external air conditioning module 25 of each of the charge discharge devices 20. The controller 26 may include information processing devices such as a CPU, a GPU, a microcomputer, a PLC, etc. and may include a memory, a communication module, etc. The controller 26 may control the cycler 22 so that the cycler 22 performs charging or discharging of the batteries based on a condition specified by the user, and control the external air conditioning module 25 based on control of the managing server 40, and provide the temperature measured by the external temperature sensor 24 to the managing server 40.

The user can connect the battery cell 30 that needs to be charged or discharged to the charge discharge device 20, and perform charging or discharging based on a desired condition. The user can directly input a condition to each of the charge discharge devices 20, may recall a condition stored in each of the charge discharge devices 20 or the managing server 40, and may input a condition to the managing server 40.

The managing server 40 may control each of the charge discharge devices 20. The managing server 40 may control a charging or discharging function of each of the charge discharge devices 20. The managing server 40 may control on/off of the external air conditioning module 25 of each of the charge discharge devices 20. The managing server 40 may be formed into a part of the charge discharge management system (CDMS). If a CDMS performs the function disclosed in the specification, the corresponding CDMS may be included in the managing server 40.

The managing server 40 may include a processor 41, a storage 42, an Input and output interface 43, and a communicator 44. The managing server 40 may be a computer. For example, the managing server 40 may be a device capable of processing information, such as a server computer, a PC, a tablet PC, a PLC, a remote control system, etc.

The processor 41 may include a CPU, a GPU, an AP, and other devices capable of processing information. The processor 41 may execute a program code to perform a temperature management method for the room 10 with a charge discharge device 20 installed based on the embodiment. The processor 41 may execute the program code by reading the program code stored in the storage 42. The temperature management method for the room 10 with a charge discharge device 20 installed based on the embodiment may be designed by the program code and may be stored in the storage 42.

The storage 42 may include a memory, a hard disk, a RAM, a ROM, a cloud storage, and other various storage media. The storage 42 may be connected to the processor 41 to allow data communication therebetween. The storage 42 may store data necessary to operate the temperature management system 1 for the room 10 with a charge discharge device 20 installed based on the embodiment. For example, the storage 42 may store serial numbers of each of the charge discharge devices 20, a first reference temperature, a second reference temperature, a first zone reference temperature, a reference capacity, an arrangement of the charge discharge devices 20 installed in the room, a preset zone, a range of adjacent charge discharge devices 20, etc.

The Input and output interface 43 may be connected to the processor 41 to allow data communication therebetween. The Input and output interface 43 may include an input device that receiving commands from the user and an output device that provides information to the user. The input device may include a keyboard, a mouse, a touchpad, a touchscreen, and other devices. The output device may include a monitor, a touch screen, a speaker, and other devices. The user can input commands or data into the managing server 40 through the Input and output interface 43, and may check information such as a current state of each of the charge discharge devices 20, the temperature of the battery evaluation room, a cooling idle capacity, etc.

The communicator 44 may be connected to the processor 41 to allow data communication therebetween. The communicator 44 may connect the managing server 40 to other devices with a wired/wireless network so that the managing server 40 receives and sends data to other devices. The communicator 44 may use LAN, WAN, Ethernet, LTE, 5G, 6G, Wi-Fi, Zigbee, Bluetooth, and various other communication methods.

The managing server 40 may adjust the temperature of the room 10 with a charge discharge device 20 installed based on a preset method. The methods described in the specification can be used in conjunction with each other.

When the peripheral temperature of one of the charge discharge devices 20 is equal to or higher than the first reference temperature, the managing server 40 may control the charge discharge device 20 so that the external air conditioning module 25 of the charge discharge device 20 is operated. When the peripheral temperature of the charge discharge device 20 is equal to or higher than the second reference temperature, the managing server 40 may control another charge discharge device 20 located within a range preset based on the charge discharge device 20 so that the external air conditioning module 25 of the charge discharge device 20 is also operated.

Figure 4:
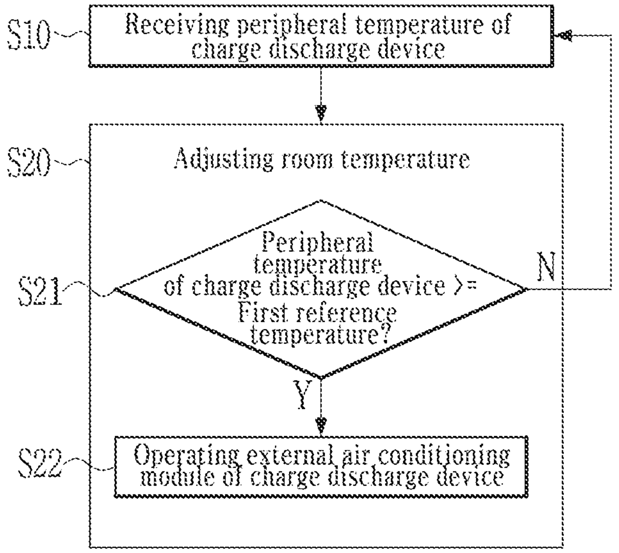
FIG. 4 is a view showing a temperature management method for a room with a charge discharge device installed based on an embodiment.
Figure 5:
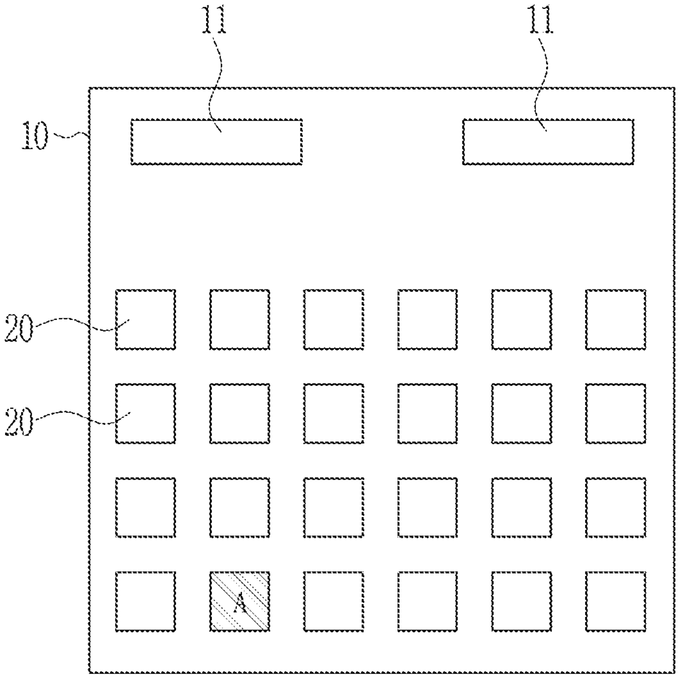
FIG. 5 is a view showing an operation state of an external air conditioning module of one charge discharge device in the room with a charge discharge device installed based on an embodiment.

FIG. 4 is a view showing a temperature management method for a room 10 with a charge discharge device 20 installed based on an embodiment. FIG. 5 is a view showing an operation state of the external air-conditioning module 25 of one charge discharge device 20 in the room 10 with a charge discharge device 20 installed based on the embodiment.

The temperature management method for the room 10 with a charge discharge device 20 installed based on the embodiment may include receiving, by the managing server 40, the peripheral temperature of each of the charge discharge devices 20 from one or more charge discharge devices 20 installed in the room, at S10, and adjusting, by the managing server 40, the room temperature by controlling operation of the external air conditioning module 25 of each of the charge discharge devices 20 based on the peripheral temperature of each of the charge discharge devices 20, at S20.

The receiving S10 of the temperature may be performed at a preset time or real time. The external temperature sensor of each of the charge discharge devices 20 may measure the peripheral temperature of each of the charge discharge devices 20 and the managing server 40 may receive the measured temperature. The managing server 40 may receive the peripheral temperature of each charge discharge device 20 from the plurality of charge discharge devices 20.

The adjusting S20 of the room temperature may be performed after receiving the peripheral temperature. In the adjusting S20 of the room temperature, when the peripheral temperature of one of the charge discharge devices 20 exceeds the preset reference, the managing server 40 may operate the external air conditioning module 25 to reduce the room temperature.

The adjusting of the room temperature S20 may include, comparing, by the managing server 40, the peripheral temperature of each of the charge discharge devices 20 and the first reference temperature, at S21, and when the peripheral temperature of one of the charge discharge devices 20 is equal to or higher than the first reference temperature, operating, by the managing server 40, the external air conditioning module 25 of the charge discharge device 20, at S22. The first reference temperature may be preset and stored in the storage 42. For example, when cooling is preset to be performed at the peripheral temperature of each of the charge discharge devices 20 of 25° C.+5° C. or more, the first reference temperature may be preset at 30° C.

The managing server 40 compares the peripheral temperature of each of the charge discharge devices 20 and the first reference temperature, and when the peripheral temperature is less than the first reference temperature, at N, the managing server 40 is returned to the receiving S10 of the peripheral temperature. When the peripheral temperature is equal to or higher than the first reference temperature, at Y, the managing server 40 may perform the operating S22 of the external air conditioning module 25 of the charge discharge device 20 having the peripheral temperature equal to or higher than the first reference temperature. Among the plurality of charge discharge devices 20 shown in FIG. 5, it is determined that the peripheral temperature of one charge discharge device 20A is equal to or higher than the first reference temperature, the managing server 40 may control the corresponding charge discharge device 20 so that the external air conditioning module 25 of the charge discharge device 20 is operated.

The charge discharge device 20 receiving a control signal from the managing server 40 may operate the external air conditioning module 25. When the external air conditioning module 25 is operated, the peripheral temperature of the charge discharge device 20 may be lowered due to cool air output from the external air conditioning module 25. When the peripheral temperature of the charge discharge device 20 is lowered to a stop temperature, the managing server 40 may stop the operation of the external air conditioning module 25. The stop temperature may be variously preset, for example, may be at 25° C.

Figure 6:
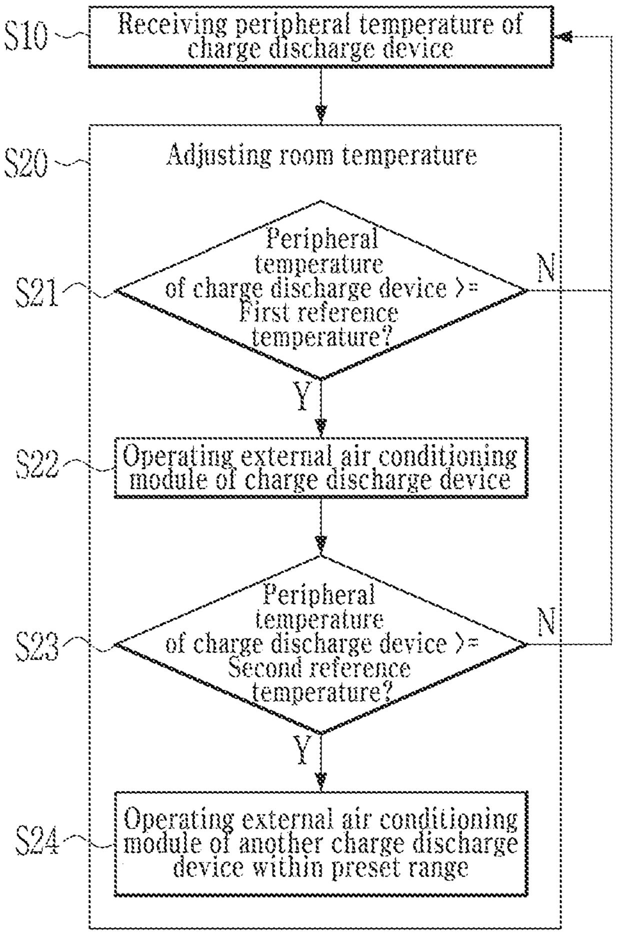
FIG. 6 is a view showing the temperature management method for the room with the charge discharge device installed based on an embodiment.
Figure 7:
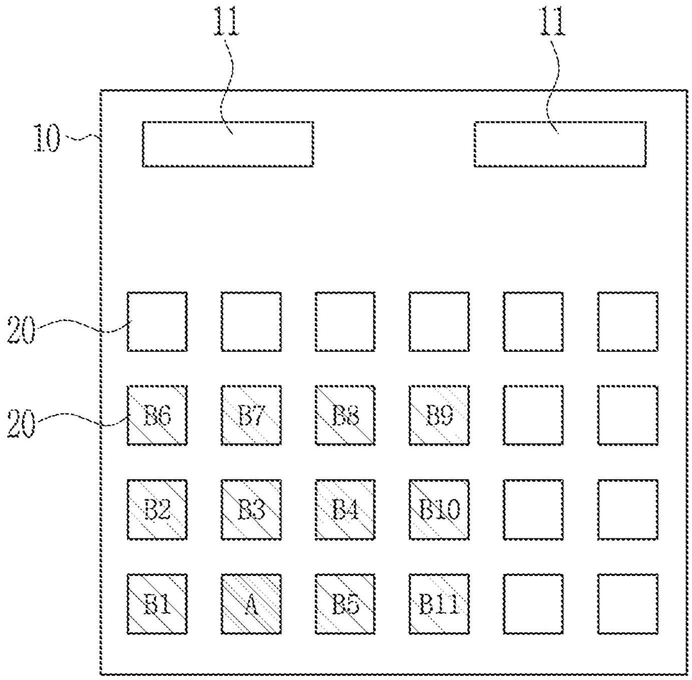
FIG. 7 is a view showing an operation state of external air conditioning modules of a plurality of charge discharge devices in the room with a charge discharge device installed based on an embodiment.

FIG. 6 is a view showing a temperature management method for the room 10 with a charge discharge device 20 installed based on an embodiment. FIG. 7 is a view showing an operation state of the external air-conditioning modules 25 of the plurality of charge discharge devices 20 in the room 10 with a charge discharge device 20 installed based on the embodiment.

The adjusting S20 of the room temperature may include comparing, by the managing server 40, the peripheral temperature of one of the charge discharge devices 20 and the second reference temperature, at S23, and when the peripheral temperature of the charge discharge device 20 is equal to or higher than the second reference temperature, operating, by the managing server 40, the external air conditioning module 25 of another charge discharge device 20 located within the range preset based on the charge discharge device 20, at S24.

Even when the external air conditioning module 25 of one of the charge discharge devices 20 having the peripheral temperature equal to or higher than the first reference temperature is operated, a heat value of the corresponding charge discharge device 20 is high or a heat value of another charge discharge device 20 is high, so the temperature may not be sufficiently lowered. In this case, the peripheral temperature of one of the charge discharge devices 20 may exceed the first reference temperature. When the peripheral temperature exceeds the second reference temperature, additional cooling is necessary, so the managing server 40 may operate the external air conditioning module 25 of another charge discharge device 20 together.

In the comparing S23 of the peripheral temperature and the second reference temperature, the managing server 40 determines whether or not the peripheral temperature is equal to or higher than the second reference temperature, with respect to one of the charge discharge devices 20 having the peripheral temperature equal to or higher than the first reference temperature and the external air conditioning module 25 thereof operated in advance.

When the peripheral temperature is less than the second reference temperature at N, the managing server 40 is returned to the receiving S10 of the peripheral temperature. When the peripheral temperature is equal to or higher than the second reference temperature, at Y, the managing server 40 may perform the operating at S24 of the external air conditioning module 25 of another charge discharge device 20 located within the range preset based on the corresponding charge discharge device 20. At this point, the preset range may be based on a setting of the user. For example, as shown in FIG. 7, the managing server 40 may operate the external air conditioning modules 25 of the charge discharge devices B1, B2, B3, B4, and B5, which are located within a range of 1 space from the charge discharge device B having the peripheral temperature equal to or higher than the second reference temperature, together. Otherwise, the managing server 40 may operate he external air conditioning modules 25 of other charge discharge devices B1 to B5 and B6 to B11 located within a range of 2 spaces from the charge discharge device B having the peripheral temperature equal to or higher than the second reference temperature, together.

Figure 8:
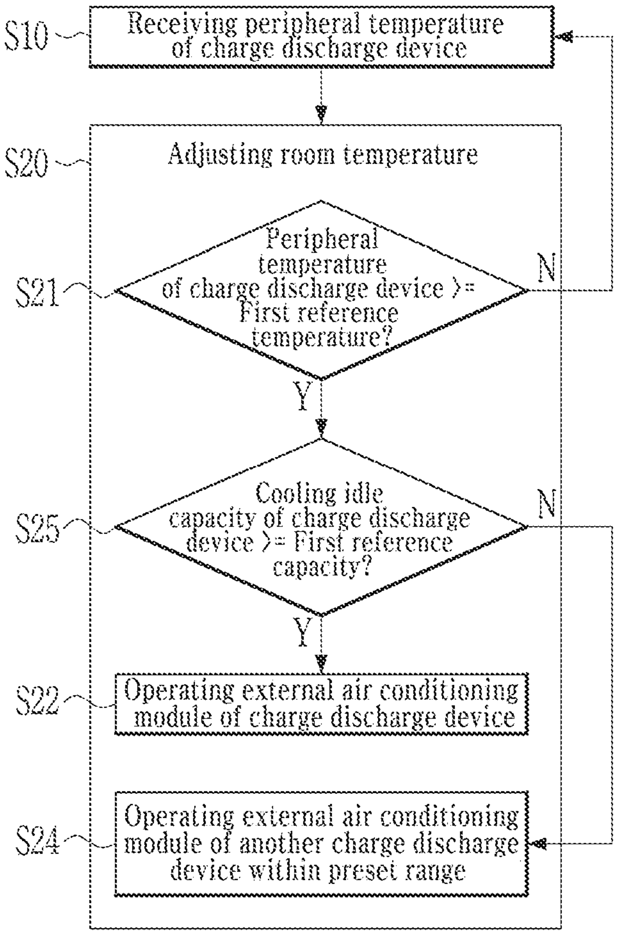
FIG. 8 is a view showing the temperature management method for a room with a charge discharge device installed based on an embodiment.

FIG. 8 is a view showing a temperature management method for the room 10 with a charge discharge device 20 installed based on an embodiment.

When the peripheral temperature is equal to or higher than the first reference temperature and a cooling idle capacity of the charge discharge device 20 is equal to or higher than a first reference capacity, the managing server 40 controls the charge discharge device 20 so that the external air conditioning module 25 of the charge discharge device 20 is operated. When the cooling idle capacity of the charge discharge device 20 is less than the first reference capacity, the managing server 40 may control another charge discharge device 20 that is installed within the range preset based on the corresponding charge discharge device 20 so that the external air conditioning module 25 of the charge discharge device 20 is operated.

A refrigerant capacity supplied from the refrigerant channel 23 of each of the charge discharge devices 20 is to reduce heat generated from the chambers 21 and the cycler 22. When charging or discharging of the battery cell 30 is performed in all the chambers 21 of each of the charge discharge devices 20, the refrigerant capacity supplied from the refrigerant channel 23 may be entirely used to cool the chambers 21 and the cycler 22. When charging or discharging of the battery cell 30 is performed in some chambers 21 of each of the charge discharge devices 20, an idle capacity may exist in the refrigerant capacity supplied from the refrigerant channel 23. A refrigerant capacity remaining from the refrigerant capacity supplied from the refrigerant channel after cooling the chambers 21 and the cycler 22 may be called a cooling idle capacity. The cooling idle capacity may be changed depending on a volume of charging or discharging the battery cell 30 by the charge discharge device 20, and may be changed depending on a schedule of charging or discharging. The controller 26 may calculate a current cooling idle capacity to provide the calculation result to the managing server 40. The controller 26 may calculate the cooling idle capacity by subtracting a refrigerant capacity required for cooling the chambers 21 and the cycler 22, where charging or discharging is currently performed, from the refrigerant capacity supplied from the refrigerant channel 23.

When the cooling idle capacity does not remain or is too small, even when the external air conditioning module 25 is operated, a sufficient cooling effect may not be obtained. The managing server 40 may further perform a process of additionally checking the cooling idle capacity and determining whether or not sufficient cooling can be performed, in addition to the operating of the external air conditioning module 25 of the charge discharge device 20 having the peripheral temperature equal to or higher than the first reference temperature.

The adjusting at S20 of the room temperature includes: comparing, by the managing server 40, the peripheral temperature of each of the charge discharge devices and the first reference temperature, at S21; when the peripheral temperature of one of the charge discharge devices 20 is equal to or higher than the first reference temperature, comparing, by the managing server 40, the cooling idle capacity and the first reference capacity, at S25; when the cooling idle capacity is equal to or higher than the first reference capacity, operating, by the managing server 40, the external air conditioning module 25 of the charge discharge device 20, at S22; and when the cooling idle capacity is less than the first reference capacity, operating the external air conditioning module 25 of another charge discharge device 20 installed within the range preset based on the corresponding charge discharge device 20, at S24.

The comparing at S21 of the peripheral temperature and the first reference temperature is the same as the above description and the detailed description thereof will be omitted. In the comparing at S25 of the cooling idle capacity and the first reference capacity, the managing server 40 may check a current cooling idle capacity of each of the charge discharge devices 20 having the peripheral temperature equal to or higher than the first reference temperature and compare the peripheral temperature and the first reference capacity. The first reference capacity may be preset depending on the first reference temperature. The first reference capacity may be designed by a capacity that can lower the peripheral temperature of the corresponding charge discharge device 20 when the external air conditioning module 25 is operated. The first reference capacity may be preset by the user.

When the cooling idle capacity is equal to or higher than the first reference capacity, at Y, the managing server 40 may perform the operating at S22 of the external air conditioning module 25 of the corresponding charge discharge device 20 having the peripheral temperature equal to or higher than the first reference temperature. When the cooling idle capacity is less than the first reference capacity, at N, sufficient cooling effect cannot be obtained by operating the external air conditioning module 25 of the corresponding charge discharge device 20 having the peripheral temperature equal to or higher than the first reference temperature, so the managing server 40 may perform the operating at S24 of the external air conditioning module 25 another charge discharge device 20 installed within the range preset based on the corresponding charge discharge device 20. At this point, the external air conditioning module 25 of the corresponding charge discharge device 20 having the peripheral temperature equal to or higher than the first reference temperature may be also operated.

The comparing at S25 of the cooling idle capacity and the first reference capacity may be also performed when the external air conditioning module 25 of another charge discharge device 20 is operated. When the cooling idle capacity of the charge discharge device 20 installed within the preset range is less than the first reference capacity, the managing server 40 may operate the external air conditioning module 25 of another charge discharge device 20 installed within the range preset based on the corresponding charge discharge device 20.

When the cooling idle capacity of the charge discharge device 20 does not remain, the managing server 40 may not operate the external air conditioning module 25.

Figure 9:
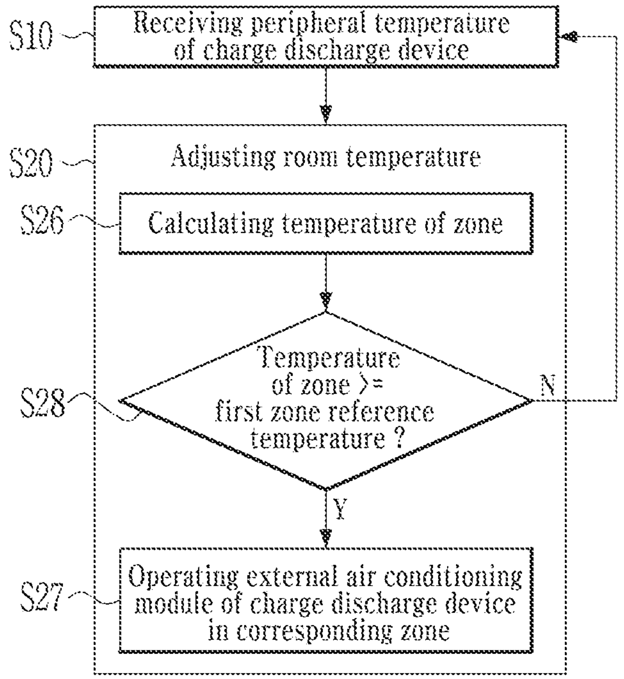
FIG. 9 is a view showing the temperature management method for a room with a charge discharge device installed based on an embodiment.
Figure 10:
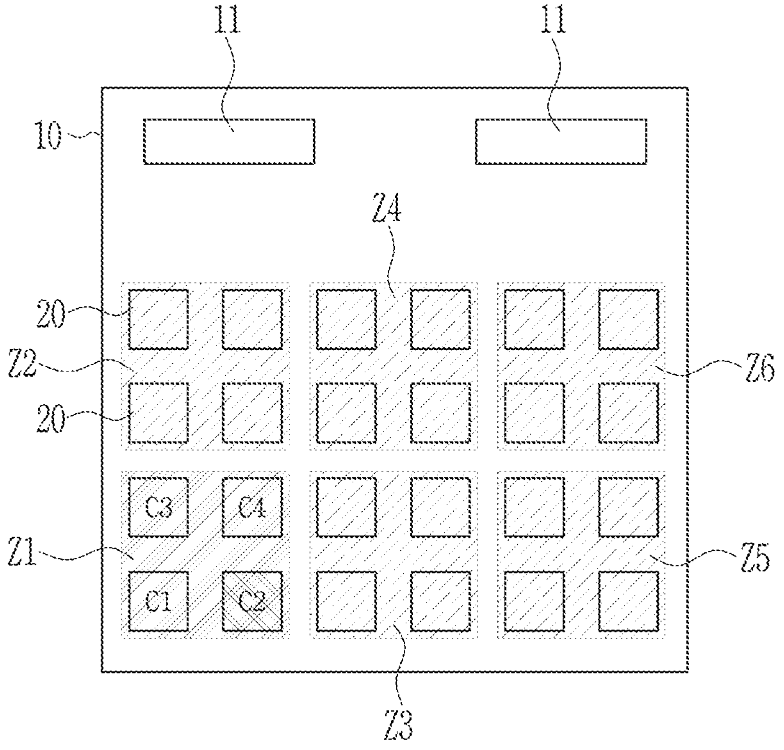
FIG. 10 is a view showing an operation state of external air conditioning modules of charge discharge devices belonging to a preset zone in the room with a charge discharge device installed based on an embodiment.

FIG. 9 is a view showing a temperature management method for the room 10 with a charge discharge device 20 installed based on an embodiment. FIG. 10 is a view showing an operation state of the external air-conditioning modules 25 of the charge discharge devices 20 located in a preset zone in the room with a charge-discharge device 20 installed based on the embodiment.

The managing server 40 may receive the peripheral temperature from the plurality of charge discharge devices 20 installed in the room, and calculate the temperature for each of a plurality of zones preset in advance based on the received temperature, when the temperature of one zone is equal to or higher than a first zone reference temperature, the managing server may control the charge discharge devices, which are located in the corresponding zone, so that the external air conditioning module 25 of each of the charge discharge devices 20 of the corresponding zone is operated.

The managing server 40 may manage the plurality of charge discharge devices 20 installed in the room by dividing the plurality of charge discharge devices 20 into zones. For example, the plurality of charge discharge devices 20 installed in the room may be grouped for 4 charge discharge devices 20 into one zone. The zone information may be stored in the storage 42. As shown in FIG. 10, 24 charge discharge devices 20 are grouped for 4 charge discharge devices into 6 zones Z1 to Z6.

The adjusting at S20 of the room temperature may include calculating the temperature of a plurality of zones preset based on the peripheral temperature received, by the managing server 40, from the plurality of charge discharge devices 20 installed in the room, at S26, and comparing the temperatures of the zones and the first zone reference temperature, at S28, and when the temperature of one of the zones is equal to or higher than the first zone reference temperature, operating the external air conditioning modules 25 of the charge discharge devices 20 located in the corresponding zone, at S27.

The calculating at S26 of the temperature of each of the zones is performed by calculating the temperature of each of the zones by using the peripheral temperature of each of the charge discharge devices 20 located in each zone. For example, the peripheral temperatures received from four charge discharge devices C1, C2, C3, and C4 located in a first zone Z1 are averaged to calculate the temperature of the first zone Z1. Similarly, the temperatures of a second zone Z2 to a sixth zone Z6 may be calculated. The managing server 40 may compare the calculated temperature of each zone and the first zone reference temperature.

In the comparing of the temperature of each zone and the first zone reference temperature, at S28, the managing server 40 may compare the calculated temperature for each zone and the first zone reference temperature. The first zone reference temperature may be preset by the user. The user may also preset a second zone reference temperature. Similar to the description referring to FIG. 6, when the zone temperature is equal to or higher than the second zone reference temperature, the managing server 40 may further operate the external air conditioning modules 25 of the charge discharge devices 20 located in another zone. At this point, the second zone reference temperature may be higher than the first zone reference temperature.

When the zone temperature is equal to or higher than the first zone reference temperature at Y, the managing server 40 may perform the operating at S27 of the external air conditioning modules 25 of the charge discharge devices 20 located in the corresponding zone. When the zone temperature is less than the first zone reference temperature at N, the managing server 40 may be returned to the receiving at S10 of the peripheral temperature of each of the charge discharge devices 20.

When the plurality of charge discharge device 20 installed in the room is divided into zones and the temperature for each zone is check and the external air conditioning modules 25 are operated, reduction of the temperature of the room can be further rapidly performed. Among the four charge discharge devices C1, C2, C3, and C4 located in the first zone, even when the peripheral temperature of one charge discharge device C2 is high, it may be determined that the temperature of the first zone Z1 is high. Since the external air conditioning modules 25 of all the charge discharge devices C1, C2, C3, and C4 located in the first zone Z1 can be operated, cooling of the zone can be rapidly performed.

Based on the embodiment of the disclosed technology described above, the charge discharge devices 20 including the external air conditioning modules 25 are installed in the room and the managing server 40 controls whether or not the external air conditioning module 25 is operated, so that cooling load of the air conditioner 11 installed in the room can be reduced, and an installation space of the air conditioner 11 can be minimized to make an effect enabling installation of more charge discharge devices 20 in the room.

The refrigerant channel 23 connected to each charge discharge device 20 receives a refrigerant from the refrigerant supplier installed outside of the room, and have a refrigerant circulation path independent from the air conditioner 11 installed inside the room, so that a cooling load of the air conditioner 11 can be reduced.

The managing server 40 may operate not only the external air conditioning module 25 of the corresponding charge discharge device 20 having high peripheral temperature 20, but also the external air conditioning module 25 of another charge discharge device 20 around the corresponding charge discharge device 20, so that cooling of the room 20 can be efficiently performed.

The disclosed technology has been described in detail through specific embodiments. The embodiments are provided to specifically describe the disclosed technology, but the disclosed technology is not limited thereto. Within the technical spirit of the disclosed technology, it will be apparent that modifications or improvements are possible by those skilled in the art.

All simple modifications or changes of the disclosed technology fall within the scope of the disclosed technology, and the specific scope of protection of the disclosed technology will be made clear by the appended claims.

What is claimed is:

1. A temperature management system, the temperature management system comprising:

a plurality of charge discharge devices installed in a room, each charge discharge device of the plurality of charge discharge devices configured to perform charging or discharging of a battery, and comprising an external temperature sensor configured to measure a peripheral temperature of the each charge discharge device and provide the measured peripheral temperature to a managing server, and an external air conditioning module configured to adjust an air temperature in the room; and a managing server configured to receive the peripheral temperature measured by the external temperature sensor from each of the plurality of charge discharge devices, and to control operation of the external air conditioning module of each of the plurality of charge discharge devices to adjust the temperature in the room, wherein the managing server is further configured to:

divide the plurality of charge discharge devices installed in the room into a plurality of zones and manage the plurality of charge discharge devices on a per-zone basis;

calculate a temperature of each zone based on the peripheral temperatures of each of the plurality of charge discharge devices included in each zone;

compare the temperature of each zone with a first zone reference temperature, and selectively operate the external air conditioning modules of each of the plurality of charge discharge devices included in a corresponding zone when a temperature of any one of the zones is equal to or higher than the first zone reference temperature; and when the temperature of the any one of the zones is equal to or higher than a second zone reference temperature higher than the first zone reference temperature, additionally operate the external air conditioning modules of charge discharge devices of the plurality of charge discharge devices included in other zones different from the corresponding zone.

2. The temperature management system of claim 1, wherein each of the plurality of charge discharge devices comprises:

one or more chambers each configured to accommodate a battery therein and perform charging or discharging of the battery;

a cycler configured to charge and discharge the battery accommodated in the chambers; and a cooling channel configured to be supplied with a refrigerant to reduce heat generated due to the charging or discharging.

3. The temperature management system of claim 2, wherein the external air conditioning module adjusts the temperature of external air by using all or part of the refrigerant supplied through the cooling channel.

4. The temperature management system of claim 3, wherein the cooling channel is a separate channel that is independent from a channel supplying a refrigerant to an air conditioner adjusting the temperature of the room with the plurality of charge discharge devices installed.

5. The temperature management system of claim 1, wherein when the peripheral temperature of one charge discharge device of the plurality of charge discharge devices is equal to or higher than a first reference temperature, and when a cooling idle capacity of the one charge discharge device is equal to or higher than a first reference capacity, the managing server controls the one charge discharge device so that the external air conditioning module of the one charge discharge device is operated, and when the cooling idle capacity of the one charge discharge device is less than the first reference capacity, the managing server controls another charge discharge device, which is installed within a range preset based on a corresponding charge discharge device of the plurality of charge discharge devices, so that the external air conditioning module of the one charge discharge device is operated.

6. A temperature management method for a room with a plurality of charge discharge devices installed, the temperature management method comprising:

receiving, by a managing server, peripheral temperature of the plurality of charge discharge devices installed in the room;

dividing, by the managing server, the plurality of charge discharge devices into a plurality of zones based on the received peripheral temperatures, and calculating a temperature for each of the zones;

comparing the temperature of each of the zones with a first zone reference temperature;

when a temperature of any one of the zones is equal to or higher than the first zone reference temperature, selectively operating an external air conditioning module of each of the plurality of charge discharge devices belonging to the corresponding zone; and when the temperature of the any one of the zones is equal to or higher than a second zone reference temperature higher than the first zone reference temperature, additionally operating an external air conditioning module of charge discharge devices of the plurality of charge discharge devices belonging to a zone other than the corresponding zone.

7. The temperature management method of claim 6, wherein each of the plurality of charge discharge devices comprises:

one or more chambers each storing a battery therein and performing charging or discharging;

a cycler charging and discharging the battery that is connected thereto through the chambers;

a cooling channel supplied with a refrigerant for reducing heat generated due to the charging or discharging;

an external temperature sensor measuring the peripheral temperature of each of the plurality of charge discharge devices to provide the measured temperature to the managing server; and the external air conditioning module adjusting the air temperature of the room based on control of the managing server.

8. The temperature management method of claim 6, wherein the operating of the external air conditioning module comprises:

comparing, by the managing server, the peripheral temperature of each of the plurality of charge discharge devices with a first reference temperature;

when the peripheral temperature of one of the plurality of charge discharge devices is equal to or higher than the first reference temperature, comparing, by the managing server, a cooling idle capacity of a corresponding charge discharge device of the plurality of charge discharge devices with a first reference capacity;

when the cooling idle capacity is equal to or higher than the first reference capacity, operating, by the managing server, an external air conditioning module of the corresponding charge discharge device; and when the cooling idle capacity is less than the first reference capacity, operating, by the managing server, an external air conditioning module of another charge discharge device installed within a predetermined range from the corresponding charge discharge device.

* * * * *